United States Patent
Chen et al.

(10) Patent No.: US 8,816,438 B2
(45) Date of Patent: Aug. 26, 2014

(54) PROCESS CHARGING PROTECTION FOR SPLIT GATE CHARGE TRAPPING FLASH

(71) Applicant: Spansion LLC, Sunnyvale, CA (US)

(72) Inventors: Chun Chen, San Jose, CA (US);
Sameer Haddad, San Jose, CA (US);
Kuo Tung Chang, Saratoga, CA (US);
Mark Ramsbey, Sunnyvale, CA (US);
Unsoon Kim, San Jose, CA (US);
Shenqing Fang, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/715,705

(22) Filed: Dec. 14, 2012

(65) Prior Publication Data
US 2014/0167135 A1    Jun. 19, 2014

(51) Int. Cl.
*H01L 27/115*  (2006.01)
*H01L 27/02*  (2006.01)
*H01L 29/792*  (2006.01)

(52) U.S. Cl.
CPC .......... *H01L 29/792* (2013.01); *H01L 27/0292* (2013.01); *H01L 27/11563* (2013.01); *H01L 27/0255* (2013.01)
USPC ........... 257/356; 257/321; 257/324; 257/326; 257/208; 257/211; 257/E29.309; 257/E21.042; 438/237; 438/264; 438/266; 438/267

(58) Field of Classification Search
CPC combination set(s) only.
See application file for complete search history.

(56) References Cited

U.S. PATENT DOCUMENTS

| | | | |
|---|---|---|---|
| 5,457,336 A * | 10/1995 | Fang et al. | 257/322 |
| 5,497,345 A * | 3/1996 | Cappelletti | 365/185.28 |
| 5,824,584 A | 10/1998 | Chen et al. | |
| 5,969,383 A | 10/1999 | Chang et al. | |
| 6,078,074 A * | 6/2000 | Takebuchi et al. | 257/316 |
| 6,112,192 A * | 8/2000 | Capek | 705/59 |
| 6,972,997 B2 | 12/2005 | Ishimaru et al. | |
| 7,057,230 B2 | 6/2006 | Tanaka et al. | |
| 7,115,943 B2 | 10/2006 | Mine et al. | |
| 7,315,066 B2 * | 1/2008 | Atkisson et al. | 257/355 |

(Continued)

OTHER PUBLICATIONS

Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.

(Continued)

*Primary Examiner* — Julio J Maldonado
*Assistant Examiner* — Molly Reida
(74) *Attorney, Agent, or Firm* — Sterne, Kessler, Goldstein & Fox P.L.L.C.

(57) ABSTRACT

A semiconductor device and method of making such device is presented herein. The semiconductor device includes a plurality of memory cells, a plurality of p-n junctions, and a metal trace of a first metal layer. Each of the plurality of memory cells includes a first gate disposed over a first dielectric, a second gate disposed over a second dielectric and adjacent to a sidewall of the first gate, a first doped region in the substrate adjacent to the first gate, and a second doped region in the substrate adjacent to the second gate. The plurality of p-n junctions are electrically isolated from the doped regions of each memory cell. The metal trace extends along a single plane between a via to the second gate of at least one memory cell in the plurality of memory cells, and a via to a p-n junction within the plurality of p-n junctions.

22 Claims, 12 Drawing Sheets

(56) References Cited

U.S. PATENT DOCUMENTS

| | | |
|---|---|---|
| 7,371,631 B2 | 5/2008 | Sakai et al. |
| 7,414,283 B2 | 8/2008 | Tanaka et al. |
| 7,504,689 B2 | 3/2009 | Hisamoto et al. |
| 7,557,005 B2 | 7/2009 | Ishii et al. |
| 7,663,176 B2 | 2/2010 | Sakai et al. |
| 7,667,259 B2 | 2/2010 | Yasui et al. |
| 7,700,992 B2 | 4/2010 | Tanaka et al. |
| 7,723,779 B2 | 5/2010 | Hisamoto et al. |
| 7,750,407 B2* | 7/2010 | Zheng et al. ............... 257/355 |
| 7,863,135 B2 | 1/2011 | Sakai et al. |
| 7,863,670 B2 | 1/2011 | Ishii et al. |
| 7,948,035 B2* | 5/2011 | Yang et al. ............... 257/356 |
| 8,017,986 B2 | 9/2011 | Tanaka et al. |
| 8,125,012 B2 | 2/2012 | Mine et al. |
| 2001/0055847 A1* | 12/2001 | Ishige ............... 438/257 |
| 2005/0006707 A1* | 1/2005 | Eriguchi et al. ............... 257/368 |
| 2005/0199940 A1* | 9/2005 | Mine et al. ............... 257/315 |
| 2005/0263816 A1* | 12/2005 | Tseng ............... 257/316 |
| 2006/0273397 A1* | 12/2006 | Adkisson et al. ............... 257/355 |
| 2008/0142889 A1* | 6/2008 | Zheng et al. ............... 257/355 |
| 2009/0206386 A1* | 8/2009 | Yang et al. ............... 257/324 |
| 2010/0295111 A1* | 11/2010 | Kawashima ............... 257/314 |
| 2011/0211396 A1 | 9/2011 | Takeuchi |

OTHER PUBLICATIONS

Matsubara, K., et al., "Highly Reliable 10ns MONOS Flash," elmicro.com/files/renesas/monos_flash_ewc_2008_for_proceedings.pdf, Renesas Technology Europe GmbH, 2008.

Tanaka, T., et al., Hitachi, "A 512kB MONOS type Flash Memory Module Embedded in a Microcontroller," 211-212, Symposium on VLSI Circuts, Digest of Technical Papers, Semiconductor & Integrated Circuits, Hitachi, Ltd., 2003.

Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Laboratories, NEC Corporation, 2008.

Yanagi, I., et al., "Quantum confinement effect of efficient hole injection in MONOS-type nonvolatile memory—the role of ultrathin i-Si/P$^+$ poly-Si stacked gate structure fabricated by laser spike annealing," 146-147, Symposium on VLSI Technology, Digest of Technical Papers, Central Research Laboratory, Hitachi Ltd., 2007.

* cited by examiner

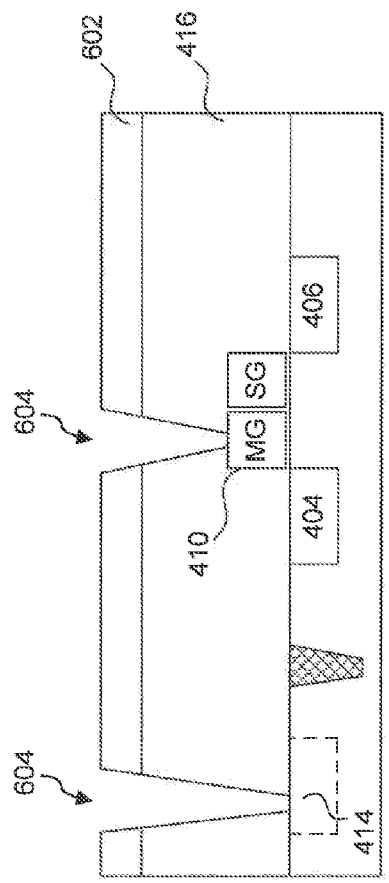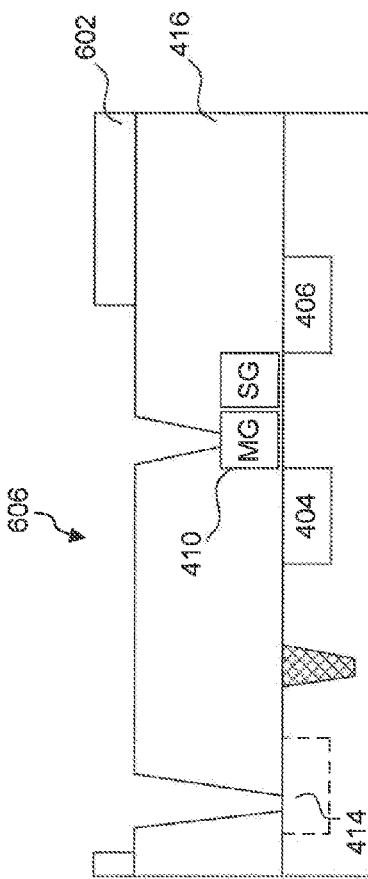

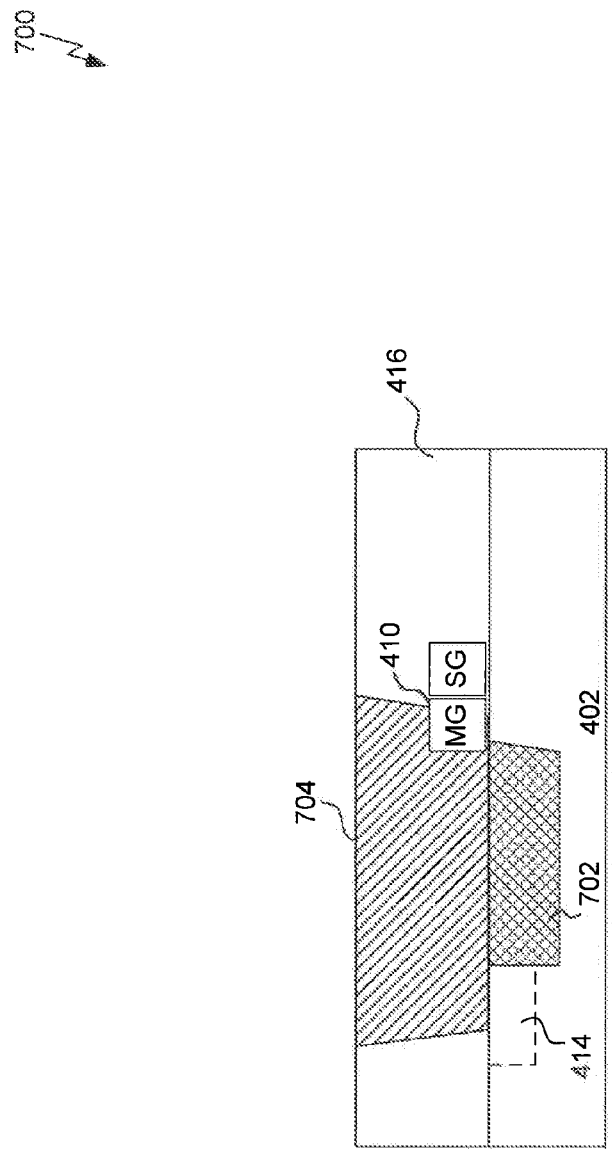

PROCESS CHARGING PROTECTION FOR SPLIT GATE CHARGE TRAPPING FLASH

BACKGROUND

1. Field

The present application relates to the fabrication of split-gate charge trapping memory cells and other field-effect transistors formed in the same substrate.

2. Background Art

A non-volatile memory, such as Flash memory, retains stored data even if power to the memory is removed. A non-volatile memory cell stores data, for example, by storing electrical charge in an electrically isolated floating gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power applications.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during programming operation. A split-gate memory cell may be programmed using techniques other than hot-carrier injection, and depending on the technique, any advantage over the conventional Flash memory cell during programming operation may vary.

Fast read time is another advantage of a split-gate memory cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erased state near or below zero, the threshold voltage of the programmed state does not need to be very high while still providing a reasonable read margin between erased and programmed states. Accordingly, the voltages applied to both select gate and memory gate in read operation can be less than or equal to the supply voltage. Therefore, not having to pump the supply voltage to a higher level makes the read operation faster.

During semiconductor manufacturing process steps, such as plasma dry etch, ion implant, or plasma enhanced CVD process steps, a large potential difference can exist between the memory gate and the substrate. This potential difference can stress the memory device, and degrade the device's performance, endurance, or reliability.

SUMMARY

It is desirable to obviate or mitigate at least one of the problems, whether identified herein or elsewhere, or to provide an alternative to existing apparatuses or methods.

According to an embodiment, there is provided a semiconductor device that includes a plurality of memory cells, a plurality of p-n junctions, and a metal trace of a first metal layer. Each of the plurality of memory cells includes a first gate disposed over a first dielectric, a second gate disposed over a second dielectric and adjacent to a sidewall of the first gate, a first doped region in the substrate adjacent to the first gate, and a second doped region in the substrate adjacent to the second gate. The plurality of p-n junctions are electrically isolated from the first and second doped regions of each of the memory cells. The metal trace extends along a single plane between a via to the second gate of at least one memory cell in the plurality of memory cells, and a via to a p-n junction within the plurality of p-n junctions.

According to another embodiment, there is provided an example method for fabricating a semiconductor device. The method includes forming a plurality of memory cells in a substrate. Each of the memory cells includes a first gate disposed over a first dielectric, a second gate disposed over a second dielectric and adjacent to a sidewall of the first gate, a first doped region in the substrate adjacent to one side of the first gate, and a second doped region in the substrate adjacent to an opposite side of the second gate. The method further includes forming a plurality of p-n junctions in the substrate. The p-n junctions are each electrically isolated from the first and second doped regions of each memory cell. The method then includes disposing a third dielectric over the substrate and the plurality of memory cells and planarizing the third dielectric. A first via is etched through the third dielectric positioned substantially over the second gate of a memory cell in the plurality of memory cells. A second via is etched through the third dielectric positioned substantially over a p-n junction in the plurality of p-n junctions. The method then includes disposing a first conductive material such that the first conductive material substantially fills the first and second vias. The method then includes forming a first metal trace to connect the first and second vias.

According to another embodiment, there is provided a semiconductor device that includes a plurality of memory cells, a plurality of p-n junctions and a metal. Each of the plurality of memory cells includes a first gate disposed over a first dielectric, a second gate disposed over a second dielectric and adjacent to a sidewall of the first gate, a first doped region in the substrate adjacent to the first gate, and a second doped region in the substrate adjacent to the second gate. The plurality of p-n junctions are electrically isolated from the first and second doped regions of each of the memory cells. The metal connects the second gate of at least one memory cell in the plurality of memory cells, and a p-n junction within the plurality of p-n junctions.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIGS. 6A-6D illustrate cross-section views of a fabrication process of another semiconductor device, according to embodiments.

FIG. 7 illustrates a cross-section view of another semiconductor device, according to an embodiment.

Figure 1:
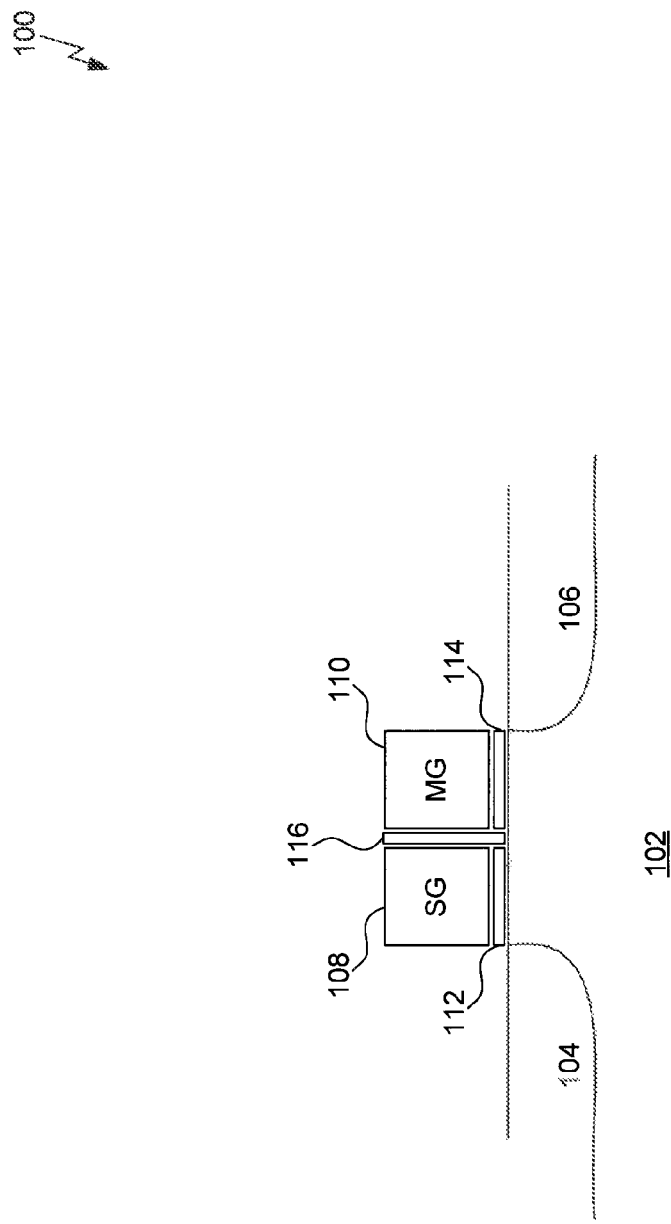
FIG. 1 illustrates a cross-section of a split-gate memory cell, according to various embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

Before describing such embodiments in more detail, it is instructive to present an example memory cell and environment in which the present embodiments may be implemented.

FIG. 1 illustrates an example of a split-gate non-volatile memory cell 100. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may be a doped polysilicon layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a charge trapping silicon nitride layer sandwiched between two silicon dioxide layers to create a three-layer stack collectively and commonly referred to as "ONO." Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they can have different dielectric properties.) As such, vertical dielectric 116 need not include the same film structure as charge trapping dielectric 114. Regions 104 and 106 are created by implanting dopants using, for example, an ion implantation technique. Regions 104 and 106 form the source or drain of the split-gate transistor depending on what potentials are applied to each. In split gate transistors, for convenience, region 104 (the region adjacent to select gate 108) is commonly referred to as the drain, while region 106 (the region adjacent to memory gate 110) is commonly referred to as the source, independent of the relative biases. It is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or at a certain bias, and select gate 108 and substrate 102 are typically grounded. A high negative voltage on the order of −8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and region 104 in the range between zero and 3 volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

The fabrication process for memory cell 100 has been described elsewhere, for example, in co-pending application Ser. No. 13/715,673, filed Dec. 14, 2012, which is incorporated by reference herein in its entirety. The fabrication of memory cell 100 may be performed by forming either select gate 108 first, or memory gate 110 first.

Briefly, when forming select gate 108 first, dielectric layer 112 is first disposed over substrate 102, followed by a gate layer. In one example, the gate layer is a polysilicon layer. The gate layer is etched to define select gate 108 over dielectric layer 112 (which may also be etched to only remain beneath select gate 108.) Next, charge trapping dielectric 114 is disposed over substrate 102. In some examples, vertical dielectric layer 116 is the same as the deposited charge trapping dielectric 114. Next, another gate layer is deposited and an etch-back process is performed to define memory gate 110 aligned adjacent to a sidewall of select gate 108, and over charge trapping dielectric 114. Once the gates have been defined, regions 104 and 106 are formed in substrate 102 via, for example, ion implantation. An optional final step may involve disposing a layer of silicide over at least a top surface of select gate 108 and memory gate 110 to improve conductivity and reduce RC delay.

The fabrication process when forming memory gate 110 first is similar to that described above when forming select gate 108 first. In this process, charge trapping dielectric 114 is disposed first over substrate 102, followed by a gate layer. The gate layer is etched to define memory gate 110 over charge trapping dielectric 114 (which may also be etched to only remain beneath memory gate 114.) Next, dielectric layer 112 is disposed over substrate 102. In some examples, vertical dielectric layer 116 is the same as the deposited dielectric layer 112. Next, another gate layer is deposited and an etch-back process is performed to define select gate 108 aligned adjacent to a sidewall of memory gate 108, and over dielectric layer 112. Once the gates have been defined, regions 104 and 106 are formed in substrate 102 via, for example, ion implantation. An optional final step may involve disposing a layer of silicide over at least a top surface of select gate 108 and memory gate 110 to improve conductivity and reduce RC delay.

Figure 2:
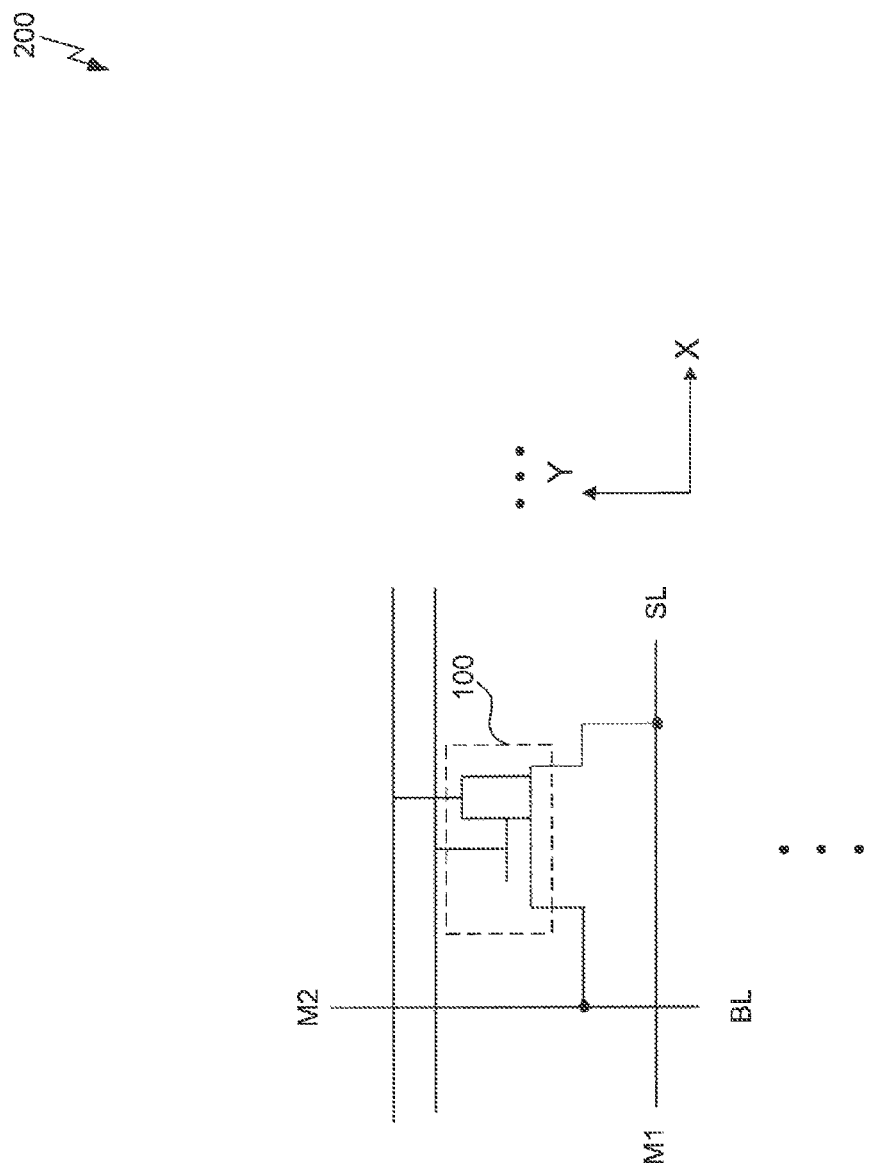
FIG. 2 illustrates connections made to a split-gate memory cell, according to various embodiments.

FIG. 2 illustrates an example circuit diagram of memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
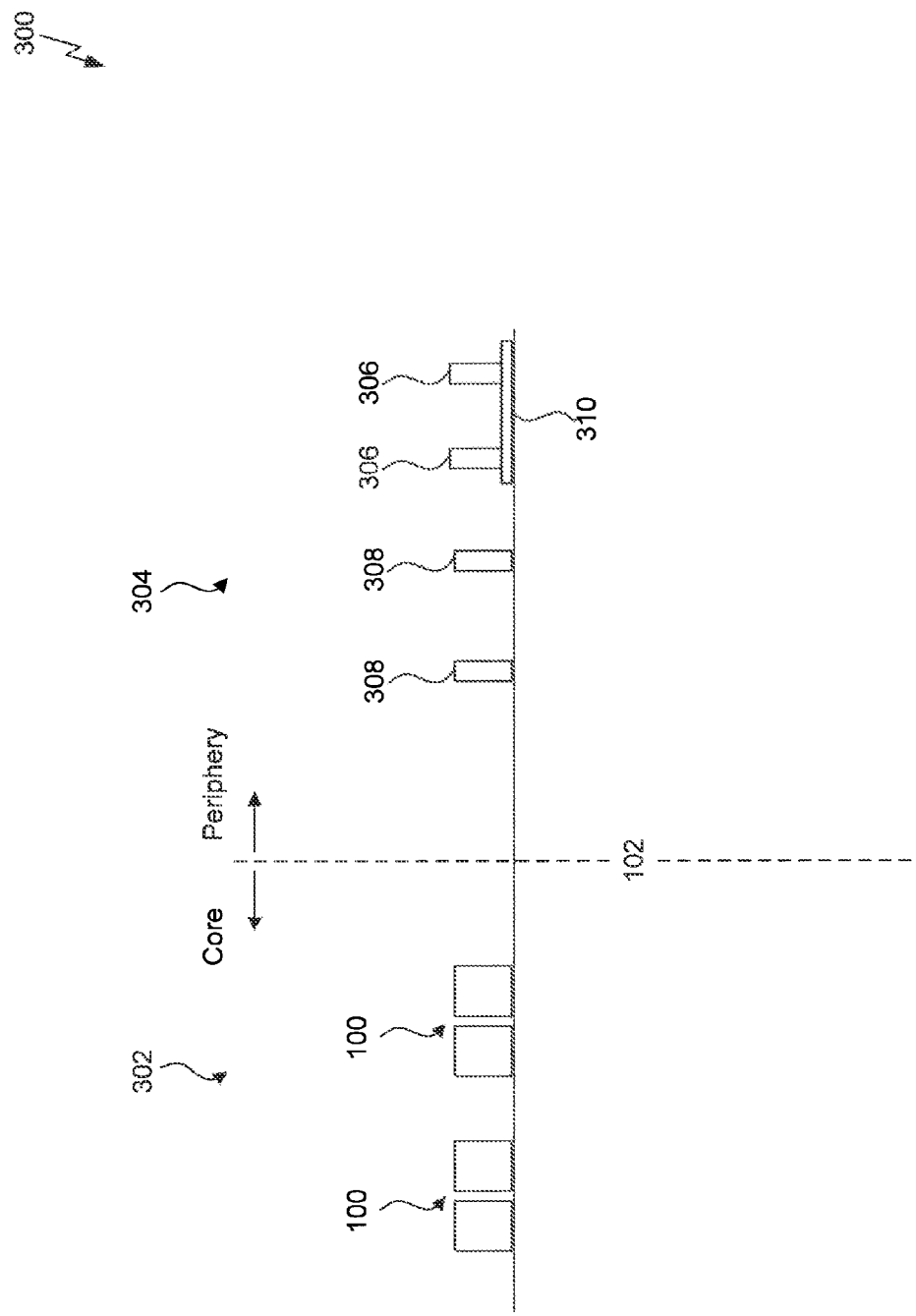
FIG. 3 illustrates field-effect devices formed in various regions of a substrate, according to various embodiments.

FIG. 3 illustrates an example semiconductor device that includes both memory and peripheral circuitry in the same substrate. In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling voltages up to 20 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308.

Figure 4:
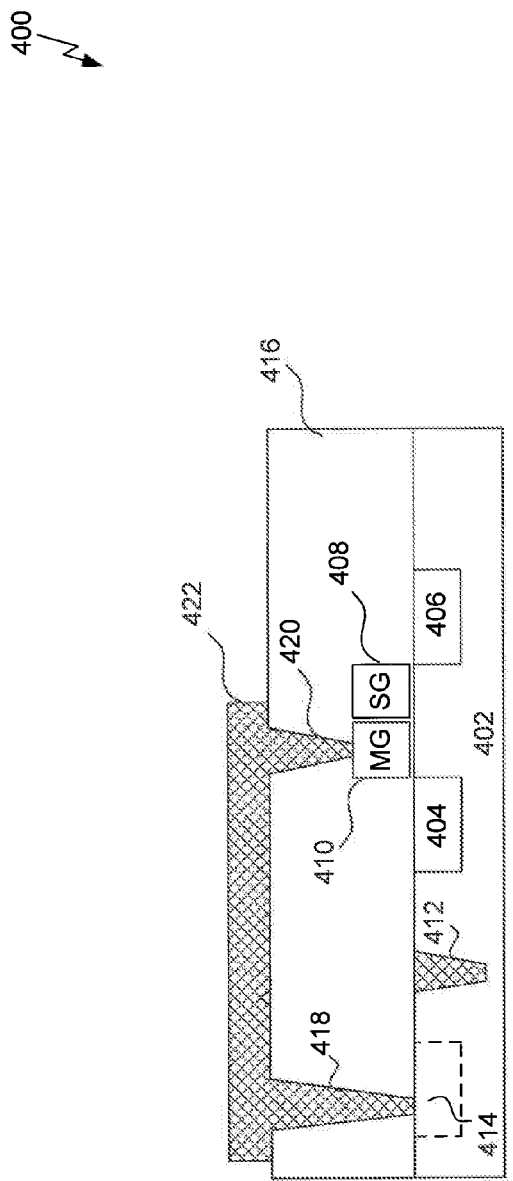
FIG. 4 illustrates a cross-section view of a semiconductor device, according to an embodiment.

FIG. 4 illustrates a cross-section view of a semiconductor device 400, according to an embodiment. Semiconductor device 400 includes a memory cell fabricated on substrate 402 with a select gate 408, a memory gate 410 and doped regions 404 and 406. For the sake of clarity, the various dielectrics of the memory cell are not illustrated, but are described above with reference to FIGS. 1-3.

Substrate 402 also includes an isolation region 412, according to an embodiment. Isolation region 412 may be, for example, a silicon trench isolation (STI). The region provides electrical isolation between the various doped regions 404 and 406 of the memory cell and a p-n junction 414 formed in substrate 402, according to an embodiment. As such, isolation region 412 may span anywhere between p-n junction 414 and the doped regions 404 and 406. In one example, isolation region 412 spans between p-n junction 414 and memory gate 410.

P-N junction 414 may act like a high-voltage diode for discharging the potential at memory gate 410, according to an embodiment. As such, a metal trace 422 connects memory gate 410 to p-n junction 414. Metal traces in general may also be thought of as metal lines. In one example, the threshold voltage of p-n junction 414 is between 10 and 25 volts. P-N junction 414 may be a triple-well diode and may include highly doped n+ or p+ regions. Furthermore, p-n junction 414 may represent more than one diode region or be a part of a plurality of diodes connected to at least one of a plurality of memory gates.

In order to connect memory gate 410 to p-n junction 414, a thick dielectric layer 416 is first disposed over substrate 402, according to an embodiment. Thick dielectric layer 416 has a thickness that is greater than a thickness of either memory gate 410 and select gate 408 after it has been deposited. An optional step of planarization may take place to form a flat upper surface of thick dielectric layer 416. The planarization may include a chemical mechanical polishing (CMP) procedure in one example, and other techniques would be apparent to a person having skill in the relevant art(s) given the description herein. Thick dielectric layer 416 may be any of a variety of insulating materials such as, for example, silicon dioxide, silicon nitride, or a low-K dielectric film.

Once thick dielectric layer 416 has been deposited, and optionally planarized, a via 420 positioned substantially over memory gate 410 and a via 418 positioned substantially over p-n junction 414 are etched in thick dielectric layer 416. The etching may be performed using any anisotropic etching technique, for example. After vias 418 and 420 are formed, they are filled with a conductive material to make electrical contact to both memory gate 410 and p-n junction 414. In one example, the same conductive material used to fill vias 418 and 420 also forms metal trace 422 on a top surface of thick dielectric layer 416. Metal trace 422 extends along a single plane on the top surface of thick dielectric layer 416 between via 418 and via 420. In one example, the conductive material that substantially fills vias 418 and 420 and forms metal trace 422 is copper. In another example, a doped polycrystalline silicon or tungsten is used to substantially fill vias 418 and 420. In another embodiment, a different conductive material may be used to form metal trace 422 than that used to fill vias 418 and 420. It should be understood that metal trace 422 may be patterned by separating a blanket metal layer across the top surface of thick dielectric layer 416.

Although FIG. 4 illustrates the connection of a single memory gate 410 to a p-n junction 414, it should be understood that this is only exemplary and that more than one memory gate 410 of more than one memory cell can connect to the same p-n junction 414, or any number of arrayed p-n junctions. Furthermore, each of the memory gates may connect to the p-n junctions using metal traces on the same level, or in another example, each memory gate may use a metal trace on a different level.

FIGS. 5A-5E illustrate an example fabrication process for forming a semiconductor device 500, according to an embodiment. In this example, a Damascene process may be used to create the interconnects and planarize the various layers. The process flow may begin following the fabrication of the memory cells.

Figure 5A:
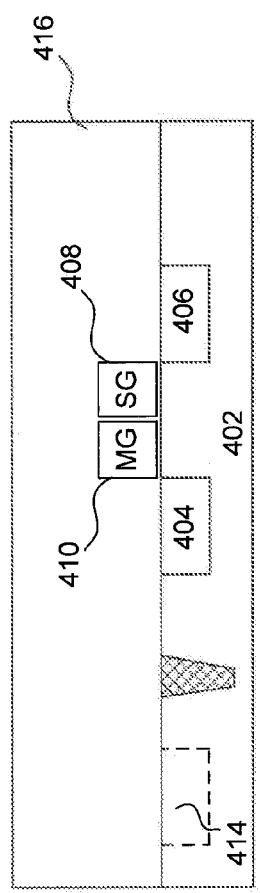
FIGS. 5A-5E illustrate cross-section views of a fabrication process of a semiconductor device, according to embodiments.

FIG. 5A illustrates the deposition of first thick dielectric layer 416 over substrate 402. In an embodiment, first thick dielectric layer 416 has a thickness that is greater than thickness of either memory gate 410 or select gate 408.

Figure 5B:
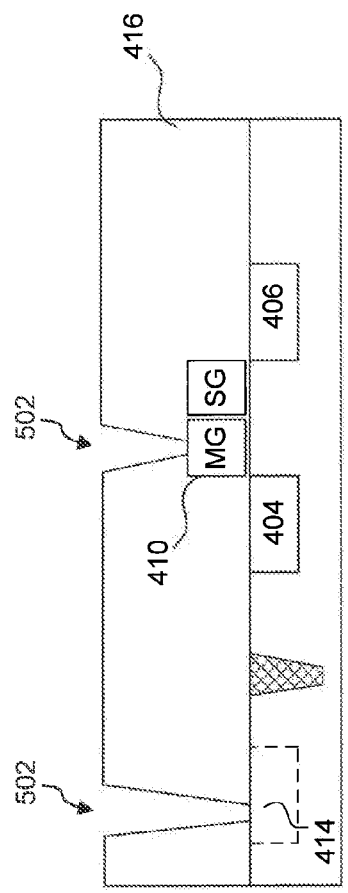

FIG. 5B illustrates a first via etch 502 that is performed to create openings located substantially above p-n junction 416 and memory gate 410, according to an embodiment. It should be understood that more than one via may be etched over either or both p-n junction 416 and memory gate 410. Furthermore, the illustrated cone shape for via etch 502 is not meant to be limiting, and in some embodiments, via etch 502 is performed to create substantially vertical sidewalls.

Figure 5C:
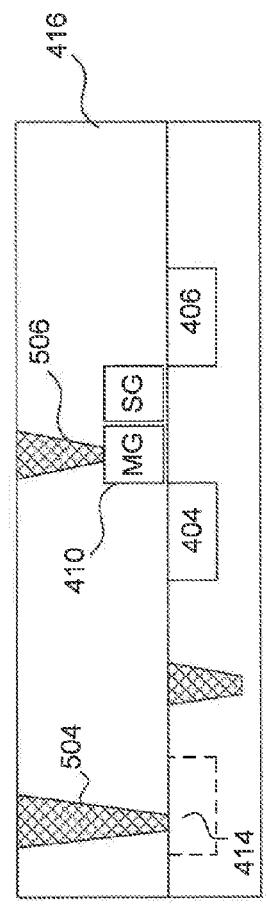

FIG. 5C illustrates the filling of vias 504 and 506 with a first conductive material, according to an embodiment. In one example, the first conductive material in vias 504 and 506 is copper. In another example, a doped polycrystalline silicon or tungsten is used to substantially fill vias 504 and 506. The deposition of the first conductive material may also deposit some of the material on the top surface of thick dielectric layer 416. In one embodiment consistent with the Damascene process, the top surface of thick dielectric layer 416 is polished such that a substantially smooth surface is formed. The polishing may result in the top surface of vias 504 and 506 being flush with the top surface of thick dielectric layer 416.

Figure 5D:
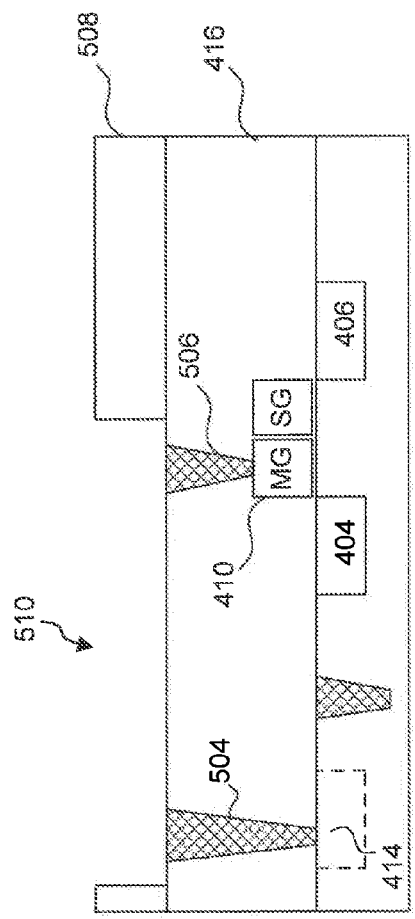

FIG. 5D illustrates the deposition and etching of second dielectric layer 508, according to an embodiment. Any pattern may be used for etching second dielectric layer 508 as long as an etched area 510 is connected between the top surface of vias 504 and 506. Second dielectric layer 502 may be any of a variety of insulating materials such as, for example, silicon dioxide, silicon nitride, or a low-K dielectric film.

Figure 5E:
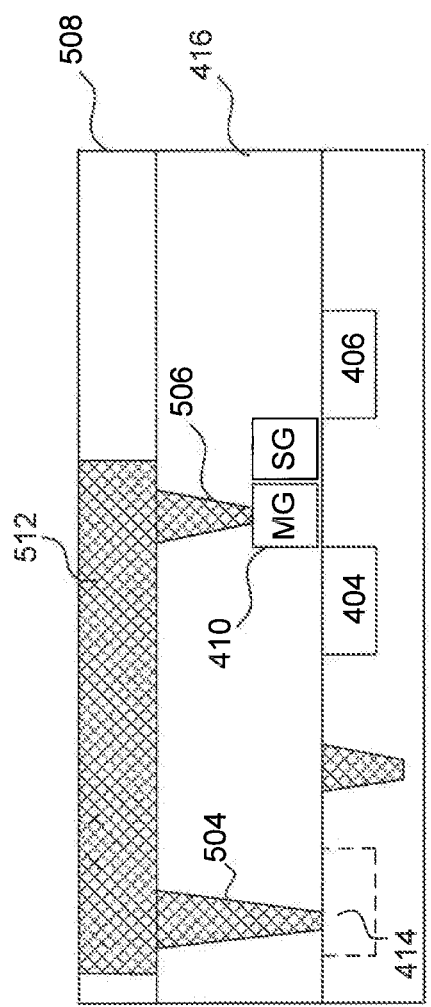

FIG. 5E illustrates the deposition of a second conductive material 512, according to an embodiment. Second conductive material 512 forms a conductive trace electrically connecting via 504 and via 506. Second conductive material 512 may be, for example, copper, tungsten, or polycrystalline silicon. It may be beneficial to use the same conductive material for both second conductive material 512 and vias 504 and 506. The deposition of second conductive material 512 may also deposit some of the material on the top surface of second dielectric layer 508. In one embodiment consistent with the Damascene process, the top surface of second dielectric layer 508 is polished such that a substantially smooth surface is formed. The polishing may result in the top surface of second conductive material 512 being flush with the top surface of second dielectric layer 508.

In another embodiment, a dual Damascene process may be performed to form a semiconductor device 600. FIGS. 6A-6D illustrate an example fabrication process for forming semiconductor device 600. The process flow begins following the fabrication of the memory cells, according to an embodiment.

Figure 6A:
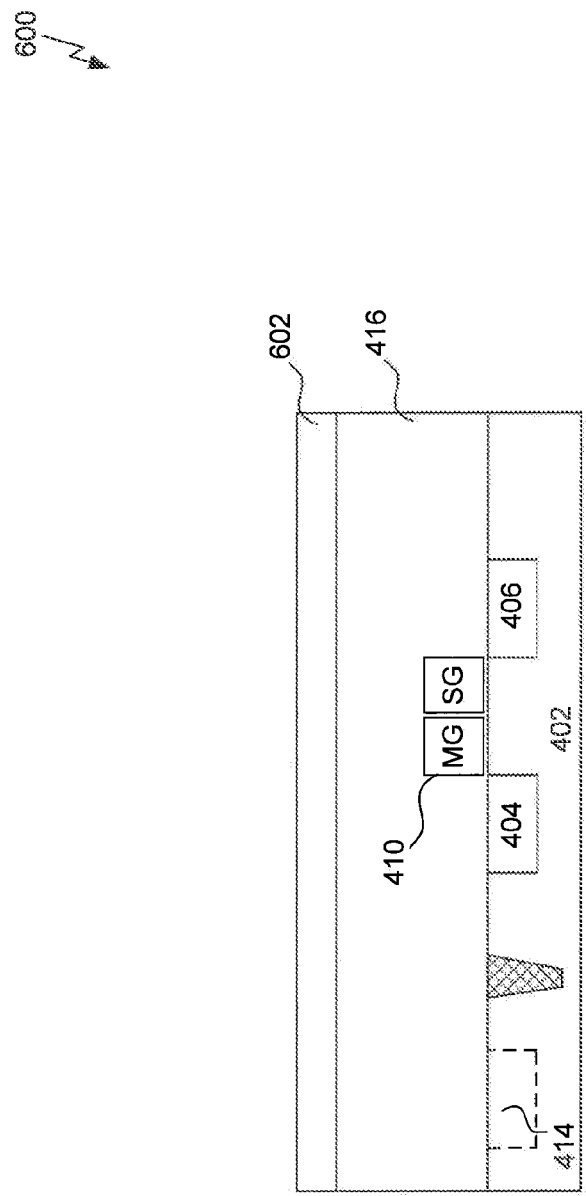

FIG. 6A illustrates first thick dielectric layer 416 disposed over substrate 402 with a second dielectric layer 602 disposed over it. Second dielectric layer 602 is disposed before any etching occurs to define vias, according to an embodiment. Second dielectric layer 602 may be substantially similar to previously described second dielectric layer 508 illustrated in FIG. 5D.

FIG. 6B illustrates a via etch 604 to define vias through both second dielectric layer 602 and first thick dielectric layer 416. The vias are located substantially over memory gate 410 and p-n junction 414.

After via etch 604 has been performed, a layer etch 606 is performed in at least a portion of second dielectric layer 602, as illustrated in FIG. 6C. The depth of layer etch 606 may be substantially the same as a thickness of second dielectric layer 602. In one embodiment, the depth of layer etch 606 defines the thickness of the metal trace that will ultimately connect the two etched vias.

Figure 6D:
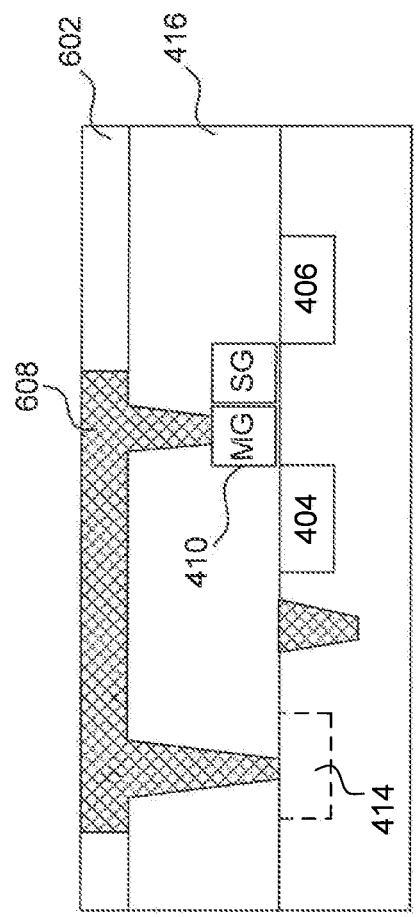

FIG. 6D illustrates filling both the vias and the etched portion of second dielectric layer 602 with a conductive material 608. Conductive material 608 provides electrical contact between memory gate 410 and p-n junction 414. Conductive material 608 may be, for example, copper, tungsten, or polycrystalline silicon. The top surface of conductive material 608 may not be flush with the top surface of second dielectric layer 602. In one example, a polishing step is performed to make the top surface of conductive material 608 substantially flush with the top surface of second dielectric layer 602. The dual Damascene process may only use a single metal disposing step to fill both the vias and form the metal trace that connects them. It should be understood that the process described with reference to FIGS. 6A-6D could also be performed in a single thick dielectric layer using similar steps as would be evident to one having skill in the relevant art(s) given the description herein.

FIG. 7 illustrates another embodiment of a semiconductor device 700. In this cross-section view, an isolation region 702 spans substantially the distance from p-n junction 414 to memory gate 410. In one example, the use of this long isolation region 702 allows for an electrical connection to be made between memory gate 410 and p-n junction 414 without the need of vias.

Thick dielectric layer 416 is disposed as discussed previously and is subsequently etched to expose a top surface of p-n junction 414 and at least a portion of memory gate 410, according to an embodiment. Afterwards, at least the etched portion of thick dielectric layer 416 is filled with a conductive material 704, according to an embodiment. Conductive material 704 provides electrical contact between memory gate 410 and p-n junction 414 substantially within the same layer as thick dielectric layer 416. Conductive material 704 may be, for example, copper, tungsten, or polycrystalline silicon. The top surface of conductive material 704 may not be flush with the top surface of thick dielectric layer 416. In one example, a polishing step is performed to make the top surface of conductive material 704 substantially flush with the top surface of thick dielectric layer 416.

Figure 8:
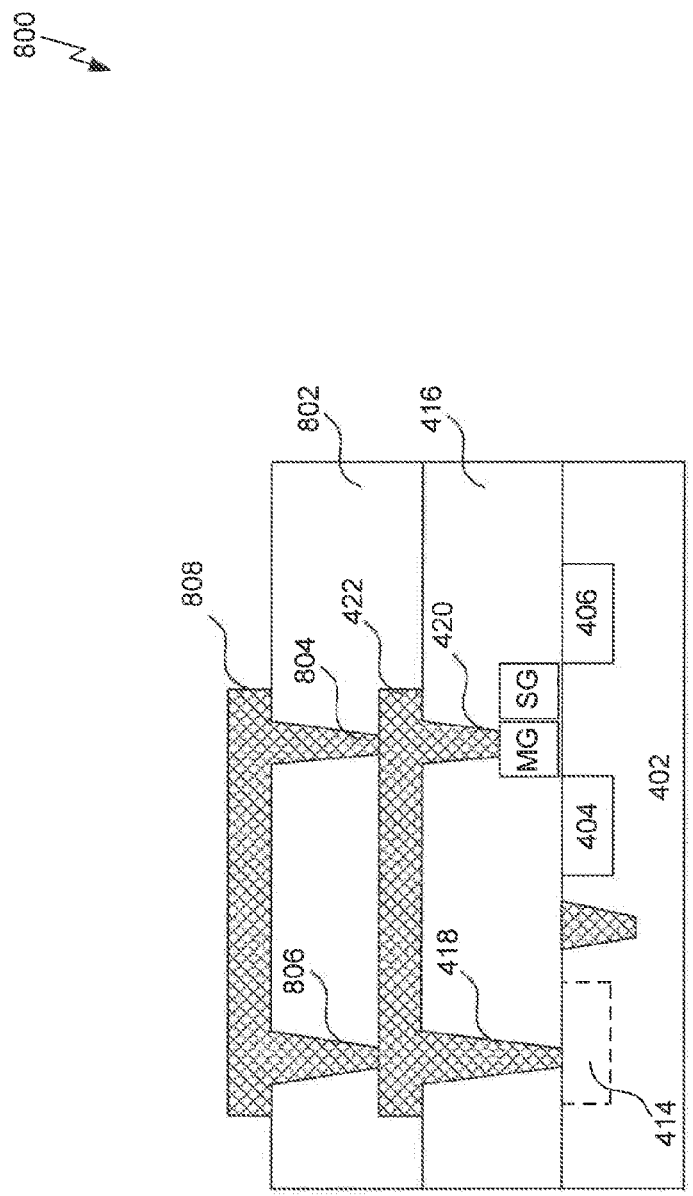
FIG. 8 illustrates a cross-section view of another semiconductor device, according to an embodiment.

FIG. 8 illustrates another embodiment of a semiconductor device 800 that includes a second thick dielectric layer 802 disposed over thick dielectric layer 416. In one example, second thick dielectric layer 802 is the same material as thick dielectric layer 416 and is at least thick enough to be thicker than metal trace 422. Second thick dielectric layer 802 may also be planarized before any further connections are made.

In one embodiment, a via 806 is etched in second thick dielectric layer 802 substantially aligned over top of via 418, while a via 804 is etched in second thick dielectric layer substantially aligned over top of via 420. After vias 804 and 806 are formed, they are substantially filled with a conductive material to make electrical contact to metal trace 422. In one example, the same conductive material used to fill vias 804 and 806 also forms a second metal trace 808 on a top surface of second thick dielectric layer 502. The conductive materials may be copper or doped polycrystalline silicon, for example. Second metal trace 808 extends along a single plane on the top surface of second thick dielectric layer 802 between via 804 and via 806. In one example, the conductive material that substantially fills vias 804 and 806 and forms second metal trace 808 is copper. In another embodiment, a different conductive material may be used to form second metal trace 808 than that used to fill vias 804 and 806. It should be understood that second metal trace 808 may be patterned from a blanket metal layer across the top surface of second thick dielectric layer 802. According to various embodiments, second metal trace 808, and vias 804, 806 may be formed using any of the processes illustrated previously in FIGS. 5-7. Furthermore, the metal layer below including metal trace 422 and vias 418, 420 may be formed using any of the processes illustrated previously in FIG. 5-7.

The use of multiple metal layers, for example, using metal trace 422 and second metal trace 508, may help to increase the conductivity and reduce parasitic effects such as, for example, the RC delay of signals traveling towards p-n junction 414. This may be particularly helpful since the width of metal trace 422 may be limited based on design rules for that particular metal layer. As such, second metal trace 508 may be patterned such that it is wider and thus has a lower resistance than metal trace 422.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The breadth and scope of the present invention should not be limited by any of the above-described exemplary embodiments, but should be defined only in accordance with the following claims and their equivalents.

What is claimed is:

1. A semiconductor device, comprising:
   a plurality of memory cells in a substrate, each of the memory cells comprising:

a first gate disposed over a first dielectric,
a second gate disposed over a second dielectric and adjacent to a sidewall of the first gate, and
a first doped region in the substrate adjacent to the first gate and a second doped region in the substrate adjacent to the second gate;
one or more p-n junctions formed within the substrate and electrically isolated from the first and second doped regions of each memory cell in the plurality of memory cells;
a metal trace of a first metal layer extending along a single plane between a first via to the second gate of at least one memory cell in the plurality of memory cells, and a second via to a p-n junction within the one or more p-n junctions; and
metal trace of a second metal layer extending along a plane between a third via to the first metal layer and a fourth via to the first metal layer.

2. The semiconductor device of claim 1, wherein the second dielectric comprises one or more dielectric layers.

3. The semiconductor device of claim 2, wherein the one or more dielectric layers comprises a stack of oxide, nitride, and oxide (ONO) layers.

4. The semiconductor device of claim 1, wherein the at least one of the first gate and the second gate is polysilicon.

5. The semiconductor device of claim 1, wherein a threshold potential of the p-n junction is between about 10 and 25 volts.

6. The semiconductor device of claim 1, wherein the one or more p-n junctions are electrically isolated from the first and second doped regions using silicon trench isolation (STI).

7. The semiconductor device of claim 1, wherein the third via is over the second gate of the at least one memory sell and the fourth via is over the p-n junction.

8. A method of fabricating a semiconductor device, comprising:
forming a plurality of memory cells in a substrate, each of the memory cells comprising:
a first gate disposed over a first dielectric,
a second gate disposed over a second dielectric and adjacent to a sidewall of the first gate, and
a first doped region in the substrate adjacent to one side of the first gate and a second doped region in the substrate adjacent to an opposite side of the second gate;
forming one or more p-n junctions in the substrate, wherein the one or more p-n junctions are each electrically isolated from the first and second doped regions of each memory cell in the plurality of memory cells;
disposing a third dielectric over the substrate and the plurality of memory cells;
planarizing the third dielectric;
etching a first via through the third dielectric positioned substantially over the second gate of a memory cell in the plurality of memory cells;
etching a second via through the third dielectric positioned substantially over a p-n junction in the plurality of one or more p-n junctions;
disposing a first conductive material such that the first conductive material substantially fills the first and second vias;
forming a first metal trace to connect the first and second vias;
disposing a fourth dielectric over the third dielectric;
planarizing the fourth dielectric;
etching a third via through the fourth dielectric;
etching a fourth via through fourth dielectric;
disposing a second conductive material such that the second conductive material substantially fills the third and fourth vias and makes electrical connection with first conductive material through the third and fourth vias; and
forming a second metal trace to connect the third and fourth vias.

9. The method of claim 8, wherein forming the plurality of memory cells comprises:
disposing a first gate layer over the first dielectric;
etching through the first gate layer to define the first gate disposed over the first dielectric;
disposing the second dielectric over the first gate and the substrate;
disposing a second gate layer over the second dielectric;
etching the second gate layer to define the second gate disposed over the second dielectric and adjacent to the sidewall of the first gate; and
forming the first and second doped regions in the substrate.

10. The method of claim 9, wherein disposing at least one of the first and second dielectrics comprises disposing one or more dielectric layers.

11. The method of claim 10, wherein disposing one or more dielectric layers comprises sequentially disposing oxide, nitride, and oxide (ONO) layers.

12. The method of claim 11, wherein disposing the second gate layer comprises disposing a layer of polysilicon.

13. The method of claim 12, wherein etching the second gate layer comprises performing an etch-back process to define the second gate that is self-aligned adjacent to the sidewall of the first gate.

14. The method of claim 9, wherein forming the plurality of memory cells further comprises forming a layer of silicide over at least a top surface of the first gate and the second gate.

15. The method of claim 8, wherein disposing a third dielectric comprises disposing an oxide layer having a thickness greater than a thickness of the first gate and greater than a thickness of the second gate.

16. The method of claim 8, wherein forming the first metal trace comprises:
disposing a fourth dielectric over the third dielectric;
etching the fourth dielectric; and
disposing a second conductive material such that the second conductive material is electrically connected to the first and second vias.

17. The method of claim 16, further comprising polishing the second conductive material.

18. The method of claim 8, wherein forming the first metal trace comprises:
disposing a second conductive material over the third dielectric; and
etching the second conductive material.

19. The method of claim 8, wherein disposing a fourth dielectric comprises disposing an oxide layer having a thickness greater than a thickness of the first conductive layer.

20. The method of claim 8, wherein disposing a second conductive material comprises disposing copper.

21. The method of claim 8, wherein etching a third via comprises etching a third via positioned substantially over the first via, and wherein etching a fourth via comprises etching a fourth via positioned substantially over the second via.

22. A semiconductor device, comprising:
a plurality of memory cells in a substrate, each of the memory cells comprising:
a first gate disposed over a first dielectric,
a second gate disposed over a second dielectric and adjacent to a sidewall of the first gate, and a first doped region in the substrate adjacent to the first gate and a second doped region in the substrate adjacent to the second gate;

one or more p-n junctions formed within the substrate and electrically isolated from the first and second doped regions of each memory cell in the plurality of memory cells;

a first metal connecting the second gate of at least one memory cell in the plurality of memory cells, and a p-n junction within the plurality of p-n junctions; and a second metal connecting a first via to a second via, the first and second vias extending between and connected to the first metal and the second metal.

* * * * *

UNITED STATES PATENT AND TRADEMARK OFFICE
CERTIFICATE OF CORRECTION

Page 1 of 1

PATENT NO. : 8,816,438 B2
APPLICATION NO. : 13/715705
DATED : August 26, 2014
INVENTOR(S) : Chen et al.

It is certified that error appears in the above-identified patent and that said Letters Patent is hereby corrected as shown below:

In the Claims:

Column 11, line 16, "metal trade of" should read --a metal trace of--;

Column 11, line 33, "memory sell" should read --memory cell--; and

Column 13, line 10, "plurality of" should read --one or more--.

Signed and Sealed this
Eleventh Day of November, 2014

Michelle K. Lee
*Deputy Director of the United States Patent and Trademark Office*